(12) United States Patent
Shiratori et al.

(10) Patent No.: US 8,875,977 B2
(45) Date of Patent: Nov. 4, 2014

(54) ELEMENT PRESSING APPARATUS AND HEATING SYSTEM USING ELEMENT PRESSING APPARATUS

(71) Applicant: Alpha Design Co., Ltd., Nagano (JP)

(72) Inventors: Toshiyuki Shiratori, Toumi (JP); Toru Kawasaki, Toumi (JP); Tadatomo Suga, Tokyo (JP); Masataka Mizukoshi, Tokyo (JP)

(73) Assignee: Alpha Design Co., Ltd., Nagano (JP)

( * ) Notice: Subject to any disclaimer, the term of this patent is extended or adjusted under 35 U.S.C. 154(b) by 0 days.

(21) Appl. No.: 14/208,526

(22) Filed: Mar. 13, 2014

(65) Prior Publication Data

US 2014/0263575 A1    Sep. 18, 2014

(30) Foreign Application Priority Data

Mar. 14, 2013    (JP) .................................. 2013-051682

(51) Int. Cl.
*B23K 37/04*    (2006.01)
*H05K 13/04*    (2006.01)

(52) U.S. Cl.
CPC .................................. *H05K 13/0478* (2013.01)
USPC .............................. 228/5.5; 228/6.2; 228/44.7

(58) Field of Classification Search
None
See application file for complete search history.

(56) References Cited

U.S. PATENT DOCUMENTS

| | | | | |
|---|---|---|---|---|
| 2,960,147 A | * | 11/1960 | Ferrell | 156/498 |
| 3,364,549 A | * | 1/1968 | Valyi | 29/890.042 |
| 3,608,809 A | * | 9/1971 | Cushman | 228/5.5 |
| 3,699,640 A | * | 10/1972 | Cranston et al. | 228/106 |
| 3,703,428 A | * | 11/1972 | Poling et al. | 156/382 |
| 3,728,778 A | * | 4/1973 | Middleton | 29/421.1 |
| 3,858,468 A | * | 1/1975 | Pasbrig | 81/185 |
| 4,087,037 A | * | 5/1978 | Schier et al. | 228/106 |
| 4,199,991 A | * | 4/1980 | Kodama | 73/706 |
| 4,691,857 A | * | 9/1987 | Friedman | 228/265 |
| 7,219,824 B2 | * | 5/2007 | Tu et al. | 228/5.5 |
| 7,882,997 B2 | * | 2/2011 | Zakel et al. | 228/5.5 |
| 7,980,445 B2 | * | 7/2011 | Budd et al. | 228/33 |
| 2003/0042294 A1 | * | 3/2003 | Matsumoto et al. | 228/115 |
| 2007/0284409 A1 | * | 12/2007 | Kobrinsky et al. | 228/44.7 |

FOREIGN PATENT DOCUMENTS

| JP | 2010-118534 | 5/2010 |
|---|---|---|
| JP | 2012-89740 | 5/2012 |

* cited by examiner

*Primary Examiner* — Kiley Stoner
(74) *Attorney, Agent, or Firm* — Greenblum & Bernstein, P.L.C.

(57) ABSTRACT

An element pressing apparatus includes: a base casing having first and second bases couplable to or separable from each other to form an arrangement space where a board and a plurality of electronic components having different heights are arranged while the first and second bases are coupled to each other; oil encapsulated in the arrangement space; an oil seal member deformed depending on a pressure of the oil; and a hydraulic pressure change portion that changes the pressure of the oil, wherein the pressure of the oil changes by the hydraulic pressure change portion to press the oil seal member to a plurality of electronic components and press the electrode terminals against the electrodes when the board and a plurality of electronic components are arranged in the arrangement space by positioning and placing each of the electrode terminals on each of the electrodes.

5 Claims, 14 Drawing Sheets

ELEMENT PRESSING APPARATUS AND HEATING SYSTEM USING ELEMENT PRESSING APPARATUS

TECHNICAL FIELD

The present invention relates to an element pressing apparatus that presses each electrode terminal of a plurality of electronic component to each electrode on a board using a solid-state diffusion bonding by applying a predetermined temperature and a predetermined pressure and a heating system using the element pressing apparatus.

CITATION LIST

Patent Literature

[Patent Literature 1] Japanese Unexamined Patent Application Publication No. 2010-118534
[Patent Literature 2] Japanese Unexamined Patent Application Publication No. 2012-89740

BACKGROUND ART

As a method of bonding an electronic component such as a semiconductor device to a board, a soldering bonding method is known in the art. The soldering bonding method has many advantages. For example, an electronic component can be bonded within a short time, a thermal deterioration generated from a soldering temperature change can be reliably controlled, and a plurality of electronic components can be bonded through a single reflow process.

However, the soldering bonding method has some disadvantages. For example, it is difficult to bond a plurality of electrode terminals of the electronic components with a minute interval, and electric and thermal conductivities of the solder are lower than those of silver and the like.

Meanwhile, as a method of bonding an electronic component to a board, there is known a solid-state diffusion bonding method in which the bonding is performed through a heating or pressing process or by applying ultrasonic vibration (for example, refer to Japanese Unexamined Patent Application Publication No. 2010-118534).

The solid-state diffusion bonding method is a method of using an atom diffusion phenomenon generated between metals (electrodes) insoluble by heating or pressing under a certain condition. In general, the solid-state diffusion bonding is performed at a temperature of, for example, several hundred degrees centigrade, which is lower than a melting point of the solder. Therefore, it is possible to lower a bonding temperature, compared to the soldering bonding method.

As such a solid-state diffusion bonding method, for example, there is known a method of directly bonding the electrode of the board and the electrode terminal of the electronic component by applying a predetermined pressure and a predetermined temperature or a bonding method by coating a metallic impalpable powder paste between the electrode terminal of the electronic component and the electrode of the board and solidifying the metallic impalpable powder paste.

The solid-state diffusion bonding method is advantageous in that it is possible to obtain an excellent heat resistance and a high electric or thermal conductivity. Therefore, the solid-state diffusion bonding is employed in various technical fields requiring an excellent thermal or electric characteristic, such as connection of a next-generation power semiconductor such as SiC (silicon carbide) or GaN (gallium nitride) or a high-luminance light-emitting diode (LED) or bonding of a large-scale integration (LSI) circuit.

Meanwhile, the solid-state diffusion bonding has some disadvantages. For example, a high pressure and a longer time are necessary to generate a sufficient diffusion reaction compared to the soldering bonding method.

Typically, a plurality of electronic components are bonded to a board. However, in some cases, each electronic component may have a different height, when a plurality of electronic components is bonded. In such a solid-state diffusion bonding of the related art, each electronic component is interposed between individual heaters, and a predetermined temperature and a predetermined pressure are applied to each of the electronic components for a certain time.

However, in the method of applying a predetermined temperature and a predetermined pressure for a certain time while each electronic component is interposed between individual heaters, a heater for the heating and a motor for the pressing are necessary for each electronic component. Therefore, a manufacturing cost of an element bonding apparatus (bonder) increases, and more time is necessary to perform the diffusion reaction. Therefore, productivity decreases disadvantageously.

In addition to the height difference, evenness is also different between a plurality of electronic components bonded to a board. Therefore, in order to evenly press a plurality of electronic components to bond them to a board, a highly accurate control such as adjustment of evenness is necessary. This may also degrade productivity.

In recent years, as electronic devices are miniaturized, a demand for miniaturization of a board also increases, and a distance between electronic components bonded to a single board or a pitch between terminals of the electronic components tends to be shortened. However, a large space is necessary to arrange heaters for heating each electronic component and a motor for applying a pressure. Therefore, in the method of applying a predetermined temperature and a predetermined pressure for a certain time by interposing each electronic component between individual heaters, it is difficult to bond the electronic components when a distance between electronic components or a pitch between terminals of electronic components is small. This makes it difficult to miniaturize the board.

Meanwhile, as a method of bonding a plurality of electronic components having different heights to a board using the solid-state diffusion bonding of the related art, there is known a bonding method in which a plurality of electronic components are disposed in a liquid to apply a hydrostatic pressure of the liquid to a plurality of electronic components while the liquid is heated (refer to paragraphs [0044], [0046], and the like of Japanese Unexamined Patent Application Publication No. 2012-89740).

SUMMARY OF THE INVENTION

Problems to be Solved by the Invention

In the aforementioned bonding method in which a plurality of electronic components are pressed by a hydrostatic pressure of a liquid, a diffusion reaction time is shortened, and a highly accurate control such as adjustment of evenness of electronic components on a board is not necessary, so that productivity is improved. Therefore, it is possible to bond the electronic components even when a pitch between the terminals is small. This also contributes to miniaturization of a board.

However, in the bonding method by pressing a plurality of electronic components using a hydrostatic pressure of a liquid, the pressure applied to the electronic components is a hydrostatic pressure. Therefore, it is difficult to press the electrode terminal of the electronic component against the electrode of the board with a sufficiently strong force and obtain a highly close contact state between the electrode terminal of the electronic component and the electrode of the board. Therefore, it may be difficult to obtain an excellent bonding state between the electrode terminal and the electrode.

In this case, it is possible to obtain the highly close contact state and the excellent bonding state between the electrode terminal of the electronic component and the electrode of the board by increasing the amount of the liquid to increase the hydrostatic pressure. However, if the amount of the liquid increases, the liquid encapsulation space also increases. Accordingly, the size of the element bonding apparatus increases disadvantageously.

In view of the aforementioned problems, there is a need for a technology capable of improving miniaturization and productivity while a highly close contact state is obtained between the electrode terminal of the electronic component and the electrode of the board.

Solutions to the Problems

According to an aspect of the invention, there is provided an element pressing apparatus for pressing a plurality of electrode terminals of a plurality of electronic components including at least two electronic components having different heights to a plurality of electrodes of a board, including: a base casing having first and second bases couplable to or separable from each other to form an arrangement space for internally arranging the board and the electronic components while the first and second bases are coupled to each other; oil encapsulated in the arrangement space; an oil seal member that seals the oil in the arrangement space and is deformed depending on a pressure of the oil; and a hydraulic pressure change portion that is supported by the base casing and changes the pressure of the oil, wherein the pressure of the oil changes by the hydraulic pressure change portion to press the oil seal member to the plurality of electronic components and press each of the electrode terminals against each of the electrodes when the board and the plurality of electronic components are arranged in the arrangement space by positioning and placing each of the electrode terminals on each of the electrodes.

As a result, the pressing is performed by using the oil seal member deformed by the pressure of the oil, and electrode terminals of the electronic components having different heights are pressed against the electrodes of the board at once.

In the element pressing apparatus described above, it is preferable that the oil seal member be formed in a pouch shape to fill the oil in the oil seal member.

As a result, the oil seal member serves as a member for preventing a leakage of oil from the arrangement space to the outside.

In the element pressing apparatus described above, it is preferable that the oil seal member be provided with a plurality of bellows portions expanding and contracting in a junction/disjunction direction of the electronic components, and the bellows portions expand or contract depending on heights of the electronic components while the plurality of bellows portions adjoin the plurality of electronic components.

As a result, a plurality of electronic components is individually pressed by a plurality of bellows portions to perform the pressing to the electronic components.

According to another aspect of the invention, there is provided a heating system using an element pressing apparatus for pressing a plurality of electrode terminals of a plurality of electronic components including at least two electronic components having different heights against a plurality of electrodes of a board, the element pressing apparatus including: a base casing having first and second bases couplable to or separable from each other to form an arrangement space for internally arranging the board and the electronic components while the first and second bases are coupled to each other; oil encapsulated in the arrangement space; an oil seal member that seals the oil in the arrangement space and is deformed depending on a pressure of the oil; and a hydraulic pressure change portion that is supported by the base casing and changes the pressure of the oil, wherein the pressure of the oil changes by the hydraulic pressure change portion to press the oil seal member to the plurality of electronic components and press each of the electrode terminals against each of the electrodes when the board and the plurality of electronic components are arranged in the arrangement space by positioning and placing each of the electrode terminals on each of the electrodes, and the element pressing apparatus is heated in a heating furnace having a heater while the oil seal member presses the plurality of electronic components.

As a result, the pressing is performed using the oil seal member deformed by the pressure of the oil in a heated state using the heater to press the electrode terminals of the electronic components having different heights against the electrodes of the board at once.

In the heating system using the element pressing apparatus described above, it is preferable that the heating furnace have an inlet port where the element pressing apparatus is loaded and an outlet port where the element pressing apparatus is unloaded, and the heating furnace be provided with a conveyor for conveying the element pressing apparatus from the inlet port to the outlet port.

As a result, the element pressing apparatus loaded from the inlet port is conveyed on the conveyor to the outlet port.

Advantageous Effects of the Invention

In the element pressing apparatus and the heating system using the element pressing apparatus according to the invention, the electrode terminals of the electronic components having different heights are press against the electrodes of the board at once while the oil seal member adjoins a plurality of electronic components having different heights, and the heating and the pressing are performed. Therefore, it is possible to obtain a highly close contact state between the electrode and the electrode terminal and improve miniaturization and productivity.

BRIEF DESCRIPTION OF DRAWINGS

The foregoing and additional features and characteristics of this disclosure will become more apparent from the following detailed description considered with the reference to the accompanying drawings, wherein.

DESCRIPTION OF EMBODIMENTS

Hereinafter, an element pressing apparatus and a heating system using the element pressing apparatus according to an embodiment of the invention will be described with reference to the accompanying drawings.

Configuration of Element Pressing Apparatus

Figure 1:
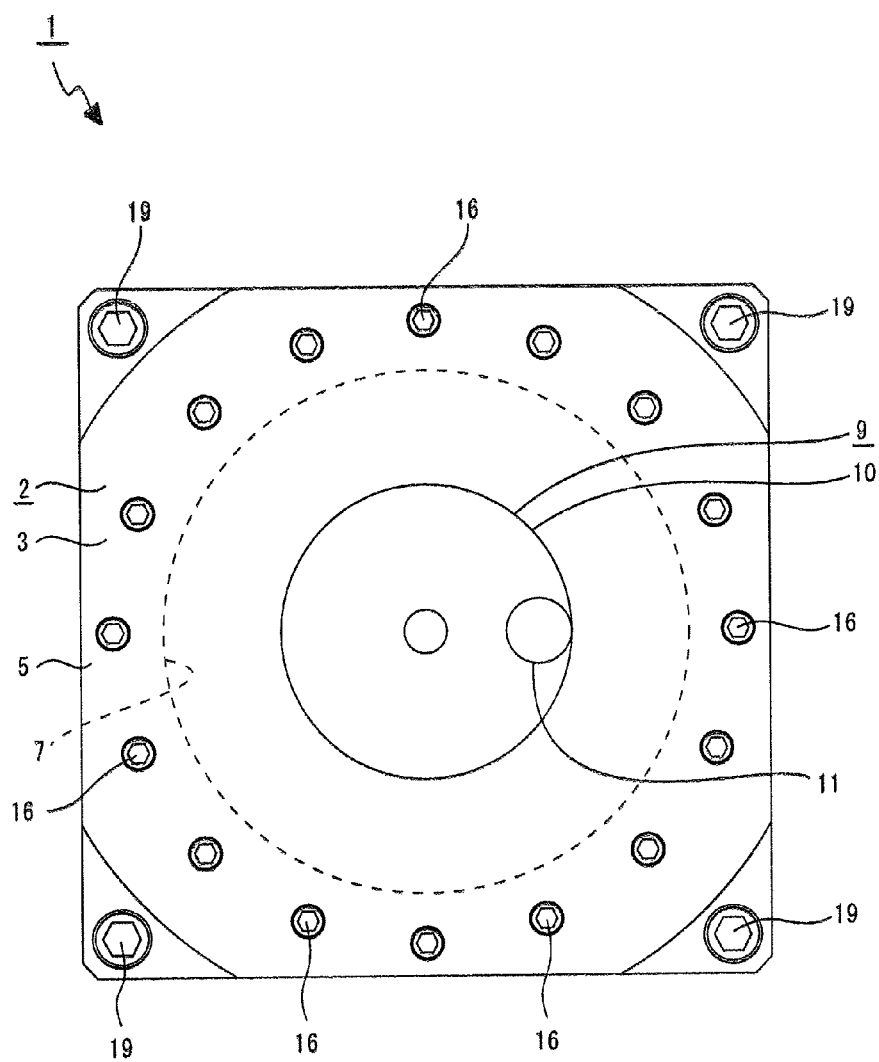
FIG. 1 is a top plan view illustrating an element pressing apparatus illustrating an element pressing apparatus and a heating system using the element pressing apparatus according to an embodiment of the invention, with FIGS. 1 to 15.
Figure 2:
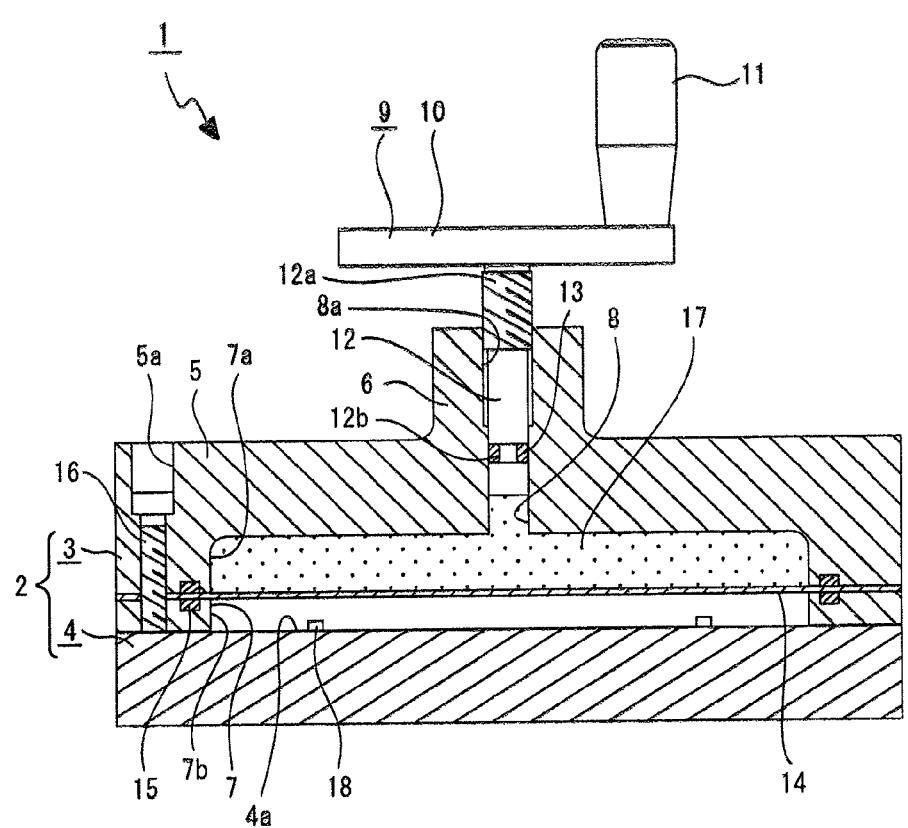
FIG. 2 is a schematic cross-sectional view illustrating the element pressing apparatus.

First, a description will be made for a configuration of the element pressing apparatus for pressing an electronic component against a board by pressing the electronic component (refer to FIGS. 1 and 2).

The element pressing apparatus 1 includes a base casing 2 and other necessary parts installed in or supported by the base casing 2. The base casing 2 has first and second bases 3 and 4 formed of a metallic material having a high thermal conductivity. The first and second bases 3 and 4 are couplable to or separable from each other in a vertical direction.

The first base 3 has a bottom-opened box-like main body 5 and a support protrusion 6 protruding upward from a center of the main body 5. An internal space of the main body 5 forms an arrangement space 7 when the first and second bases 3 and 4 are coupled to each other. The arrangement space 7 is a hermetically sealed space while the first and second bases 3 and 4 are coupled to each other.

The main body 5 is formed, for example, substantially in a rectangular shape as seen in a plan view. In the main body 5, vertically perforated screw fastening holes 5a are formed at equal intervals in a circumferential direction.

A vertically perforated support hole 8 is formed in the center of the first base 3. The support hole 8 is formed to extend from the support protrusion 6 to the main body 5. A thread 8a is formed in the upper end side of the support hole 8.

The hydraulic pressure change portion 9 is rotatably supported by the first base 3. The hydraulic pressure change portion 9 includes a disk portion 10 directed to a vertical direction, a handle portion 11 provided on an upper surface of the disk portion 10, and a supported shaft portion 12 protruding downward from the center of the disk portion 10. A screw-joining portion 12a is provided in the upper end side of the supported shaft portion 12, and an annular installation trench 12b is formed in the vicinity of the lower end of the supported shaft portion 12. A packing 13 formed of a rubber material or a resin material is installed in the installation trench 12b.

The supported shaft portion 12 is inserted downward into the support hole 8, and the screw-joining portion 12a is screwed to the thread 8a, so that the hydraulic pressure change portion 9 is rotatably supported by the first base 3 in an axial rotation direction of the supported shaft portion 12. In this case, the packing 13 strongly contacts the circumferential surface of the support hole 8.

As the handle portion 11 of the hydraulic pressure change portion 9 is operated, the entire hydraulic pressure change portion 9 is rotated, and the screw-joining portion 12a is shifted to the thread 8a, so that the hydraulic pressure change portion 9 is vertically displaced with respect to the first base 3 depending on the rotation direction. Therefore, the supported shaft portion 12 is vertically displaced in the support hole 8.

An oil seal member 14 is installed in the vicinity of the lower end of the main body 5. The oil seal member 14 is formed of, for example, stainless steel, rubber, and the like having a thin-film shape so that it can be deformed depending on a (hydraulic) oil pressure. The oil seal member 14 is positioned in the arrangement space 7 except for its outer circumference, and a part close to the outer circumference is sealed by an O-ring 15 arranged inside the main body 5.

The oil seal member 14 is installed in the main body 5 using installation screws 16. The installation screws 16 are screwed to the screw fastening holes 5a of the main body 5 and are fastened to the outer circumference of the oil seal member 14.

The arrangement space 7 of the main body 5 is divided by the oil seal member 14 into upper and lower parts, in which the upper part serves as an oil encapsulation portion 7a, and the lower part serves as a board placing portion 7b.

Oil 17 is encapsulated in the oil encapsulation portion 7a of the arrangement space 7. In addition, since the oil encapsulation portion 7a communicates with the support hole 8, the oil 17 can flow to the support hole 8. The packing 13 installed in the supported shaft portion 12 of the hydraulic pressure change portion 9 and the O-ring 15 installed in the outer circumferential joining portion of the oil seal member 14 prevent a leakage of the oil 17 encapsulated in the arrangement space 7 and the like.

As the hydraulic pressure change portion 9 is rotated, the supported shaft portion 12 of the hydraulic pressure change portion 9 is vertically displaced in the support hole 8 as described above to change a contact position between the lower end surface of the supported shaft portion 12 and the oil 17.

The second base 4 is formed in a flat plate shape and has a top surface serving as a board placing surface 4a. A board installation portion 18 is provided on the board placing surface 4a.

In the element pressing apparatus 1 configured as described above, the first and second bases 3 and 4 are coupliable to or separable from each other as described above. The connection between the first and second bases 3 and 4 is performed, for example, by fastening the fastening screws 19 in four corners. In addition, the separation of the first and second bases 3 and 4 is performed by unfastening the fastening screws 19.

Configuration of Heating Furnace

Figure 3:
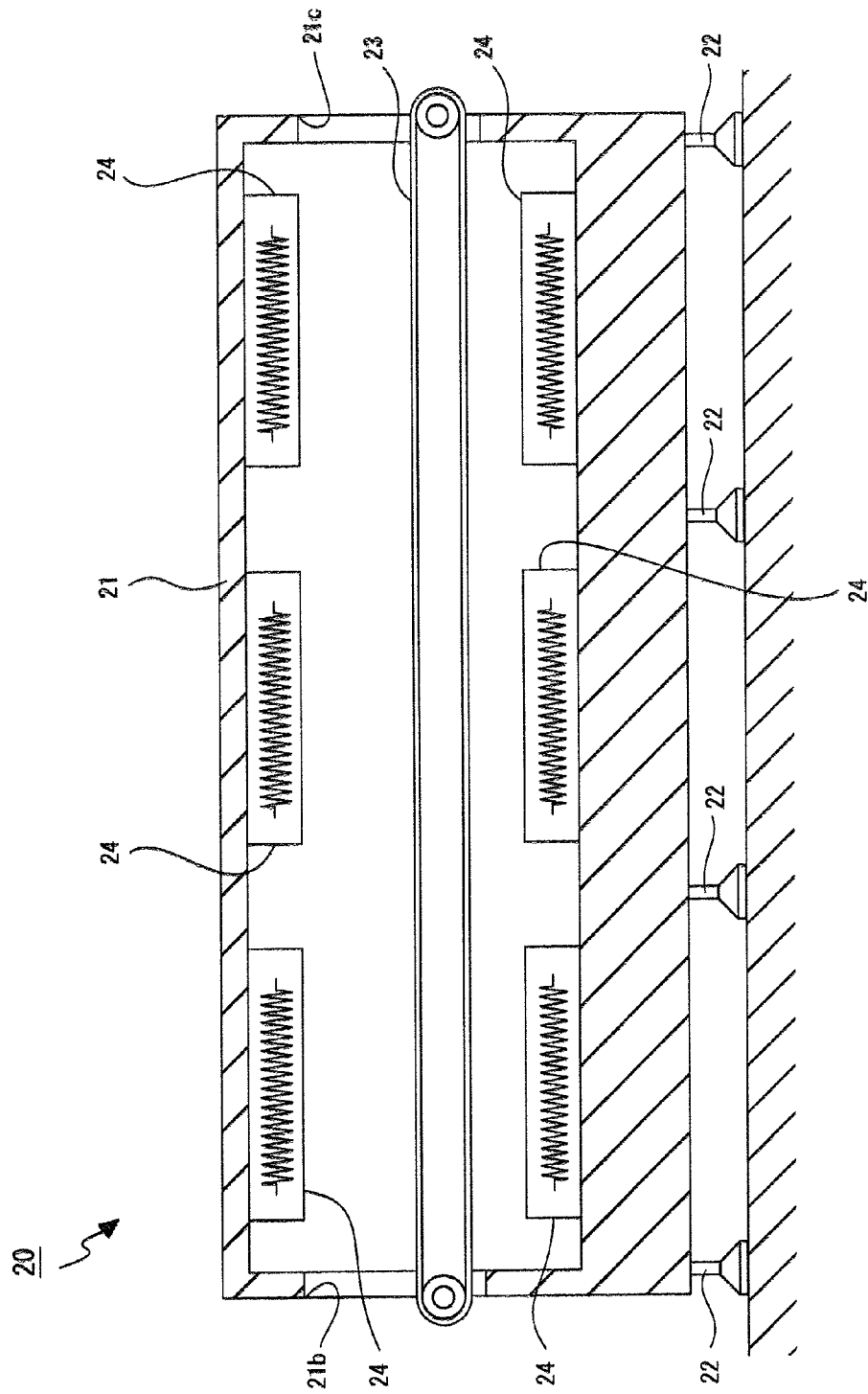
FIG. 3 is a schematic side view illustrating a part of a heating furnace as a cross section.

Next, a description will be made for a configuration of a heating furnace that heats the element pressing apparatus 1 (refer to FIG. 3). The heating furnace is used in the heating system using the element pressing apparatus 1 to heat the element pressing apparatus 1 in order to bond a plurality of electronic components to a board described below based on a solid-state diffusion method.

The heating furnace 20 includes a housing 21 and each necessary part arranged inside the housing 21.

The inside of the housing 21 serves as a work chamber 21a. The housing 21 has an inlet port 21b and an outlet port 21c. The housing 21 is placed on a floor using support legs 22.

A conveyor 23 is arranged in the work chamber 21a. The conveyor 23 extends from the inlet port 21b to the outlet port 21c.

Heaters 24 are arranged in the work chamber 21a. The heaters 24 are positioned over and under the conveyor 23 at intervals along a conveyance direction of the conveyor 23.

Circuit Board

Figure 4:
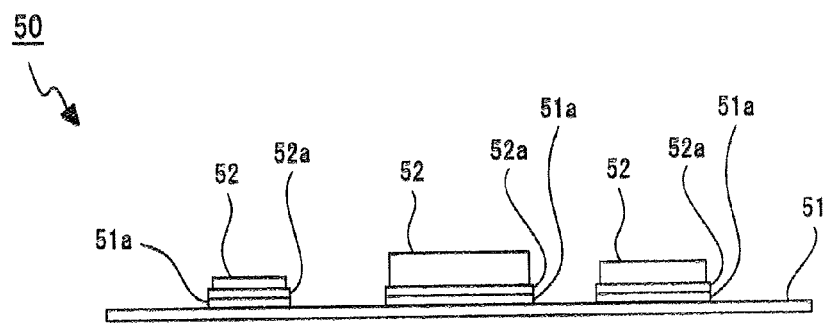
FIG. 4 is a front view illustrating a circuit board.

Next, a description will be made for an exemplary circuit board arranged in the arrangement space 7 of the element pressing apparatus 1 (refer to FIG. 4).

The circuit board 50 is configured by pressing a plurality of electronic components 52 against a board 51 so as to bond the plurality of electronic components 52 to the board 51 using the element pressing apparatus 1 by a solid-state diffusion method. It is noted that a sequence of the solid-state diffusion bonding using the element pressing apparatus 1 will be described below.

A driving circuit (not illustrated) is formed on the board 51, and a plurality of electrodes 51a coupled to the driving circuit are provided on an upper surface of the board 51. The electrodes 51a are formed of, for example, a predetermined metallic material such as gold, silver, copper, tin, nickel, zinc, antimony, bismuth, indium, or alloy thereof.

At least two electronic components 52 having different heights are included in the electronic components 52. Electrode terminals 52a are provided on the lower surfaces thereof. The electrode terminals 52a are formed of, for example, a predetermined metallic material such as gold, silver, copper, tin, nickel, zinc, antimony, bismuth, indium, or alloy thereof.

It is noted that the electrode 51a of the board 51 and the electrode terminal 52a of the electronic component 52 are schematically illustrated in a flat plate shape in the drawings.

Solid-State Diffusion Bonding

Hereinafter, a description will be made for a sequence of the solid-state diffusion bonding for the board 51 of the electronic components 52 (refer to FIGS. 5 to 12). The solid-state diffusion bonding is performed by applying a predetermined temperature and a predetermined pressure in a heating system using the element pressing apparatus 1 to bond the electrode terminal 52a of the electronic component 52 and the electrode 51a of the board 51.

First, before the element pressing apparatus 1 is used, a preliminary heating is performed in a preliminary heating apparatus (not illustrated) while the electrodes 51a of the board 51 and the electrode terminals 52a of the electronic components 52 are aligned in an appropriate position. The preliminary heating is performed while the electronic components 52 are pressed, and the electronic components 52 are pressed against the board 1 at a certain pressure.

By performing the preliminary heating in a pressed condition as described above, the electrode terminals 52a of the electronic components 52 are (preliminarily) bonded to the electrodes 51a of the board 51 with a weak bonding force.

Since the electronic components 52 have different heights as described above, the positions of the upper surfaces of the electronic components 52 are different depending on the heights of the electronic components 52 after the preliminary heating while positions of the electrode terminals 52a are aligned with positions of the electrodes 51a.

Figure 5:
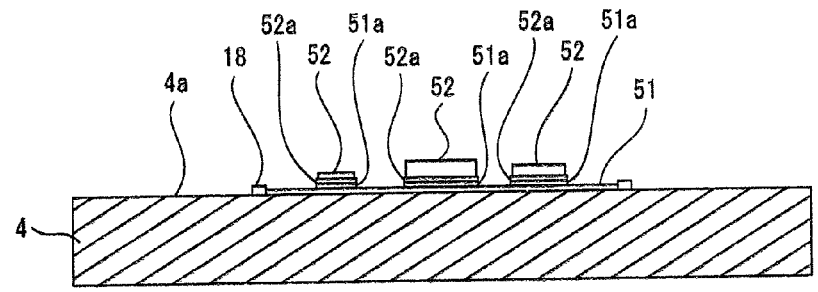
FIG. 5 is a schematic cross-sectional view illustrating a state that a board and the like are placed on a second base, illustrating a sequence of a solid-state diffusion bonding using the element pressing apparatus, with FIGS. 5 to 12.

Then, the board 51 having the preliminarily bonded electronic components 52 is unloaded from the preliminary heating apparatus and is placed on the board placing surface 4a of the second base 4 of the element pressing apparatus 1 (refer to FIG. 5). In this case, the board 51 is installed in the second base 4 by performing positioning using the board installation portion 18.

Figure 6:
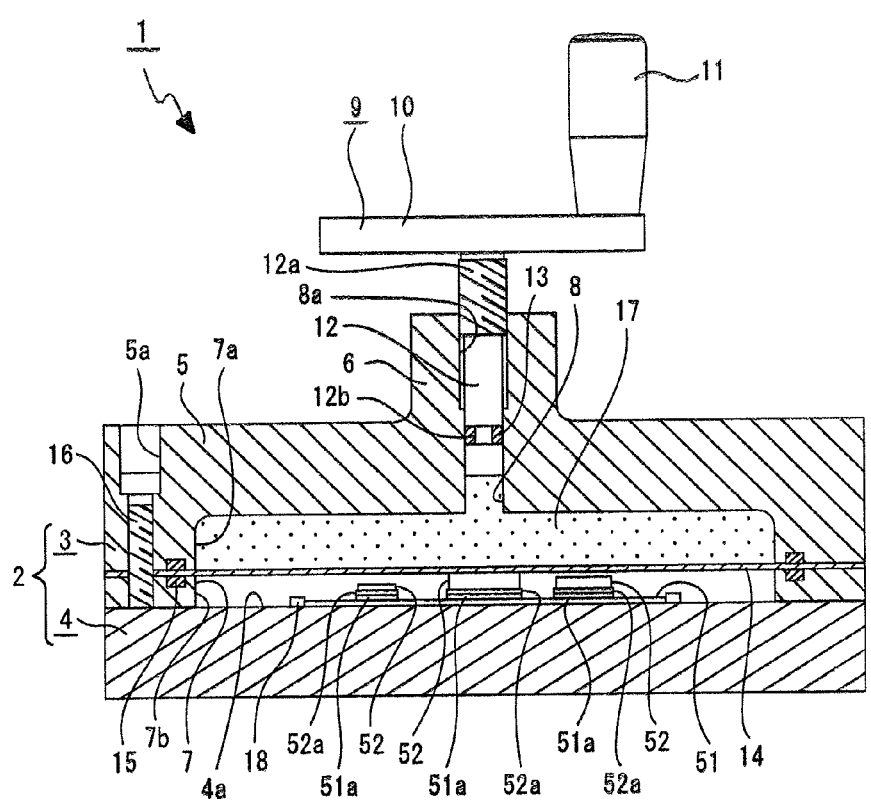
FIG. 6 is a schematic cross-sectional view illustrating a state that the first and second bases are coupled to each other.

Then, the first or second base 3 or 4 is moved using a shift mechanism (not illustrated), and the first and second bases 3 and 4 are coupled to each other by fastening the fastening screws 19 (refer to FIG. 6). Therefore, the board 51 and the electronic components 52 are arranged on the board arrangement portion 7b of the arrangement space 7. In this case, the oil seal member 14 has, for example, a substantially flat plate shape, and the supported shaft portion 12 of the hydraulic pressure change portion 9 is held in an initial position of the upper side.

Figure 7:
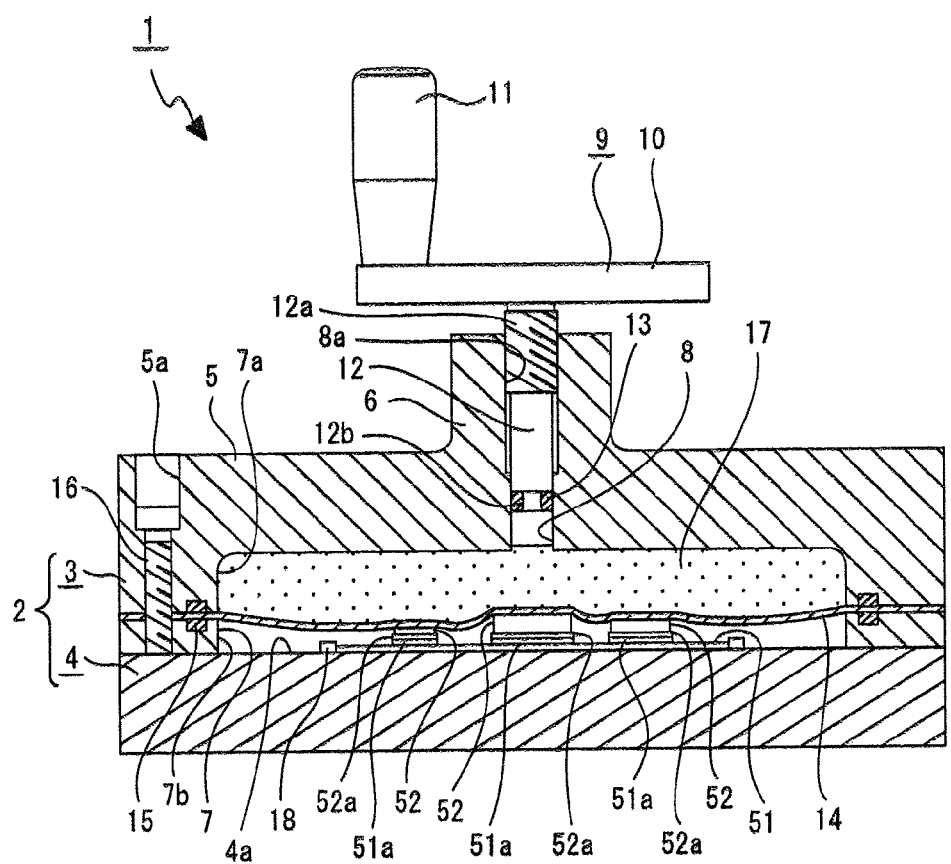
FIG. 7 is a schematic cross-sectional view illustrating a state that the electronic component is pressed.
Figure 8:
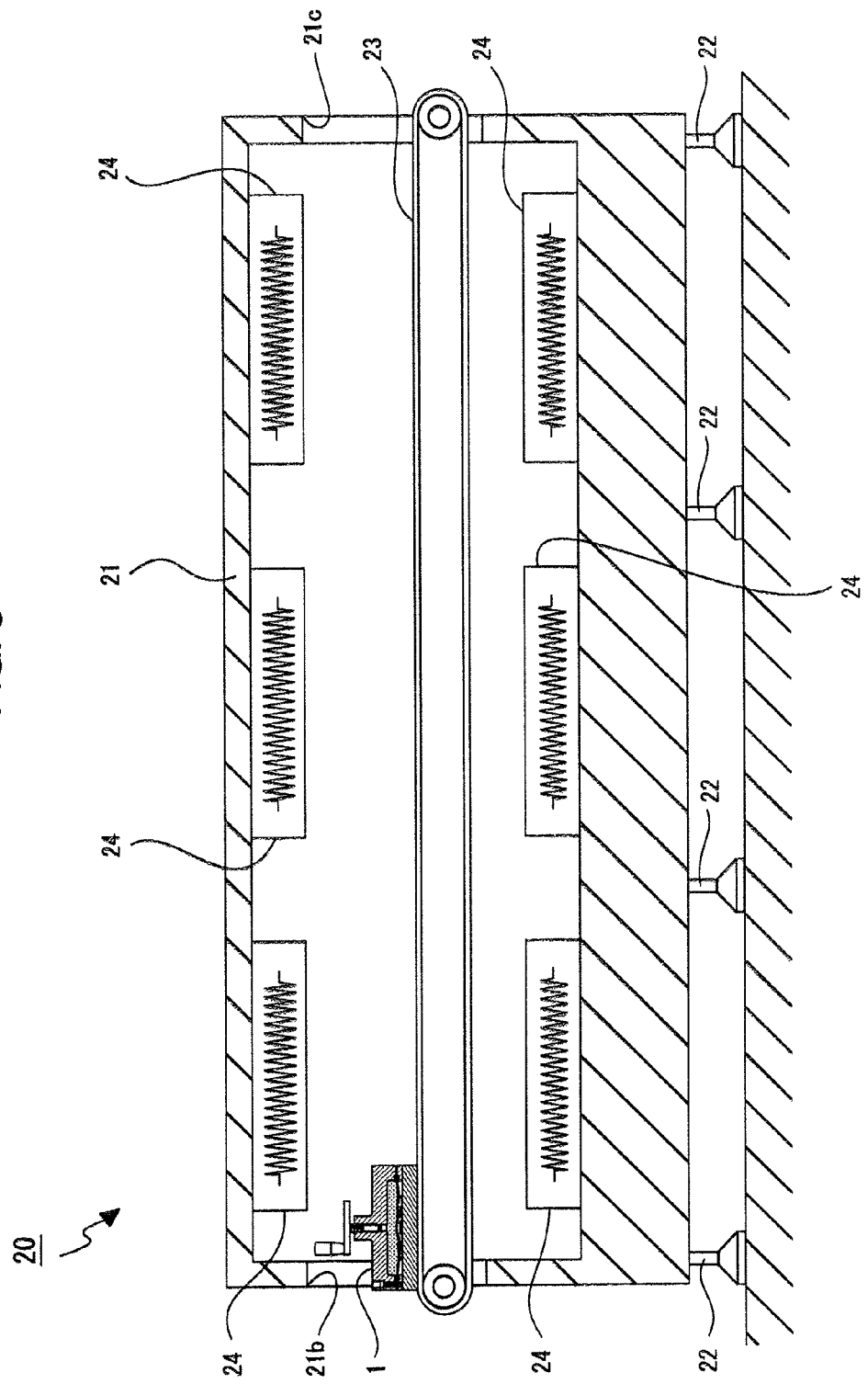
FIG. 8 is a partially cross-sectioned schematic side view illustrating a state that the element pressing apparatus is loaded into the heating furnace.

Then, the electronic components 52 are pressed (refer to FIG. 7). The pressing is performed by displacing the supported shaft portion 12 downward by operating the handle portion 11 of the hydraulic pressure change portion 9, so that the oil 17 is pushed by the supported shaft portion 12. As the oil 17 is pushed by the supported shaft portion 12, a pressure of the oil 17 to the oil seal member 14 increases, so that the oil seal member 14 is deformed to press the upper surfaces of the electronic components 52 downward at once.

The deformed oil seal member 14 is shaped to follow the positions of each top surface of the electronic components 52, and the electronic components 52a are pressed against the electrodes 51a of the board 51.

Subsequently, the element pressing apparatus 1 is loaded into the heating furnace 20 while the electronic components 52 are pressed, and the electrode terminals 52a are pressed against the electrodes 51a at once as described above (refer to FIG. 8). In this case, the element pressing apparatus 1 is loaded through the inlet port 21b and is placed on the conveyor 23.

Figure 9:
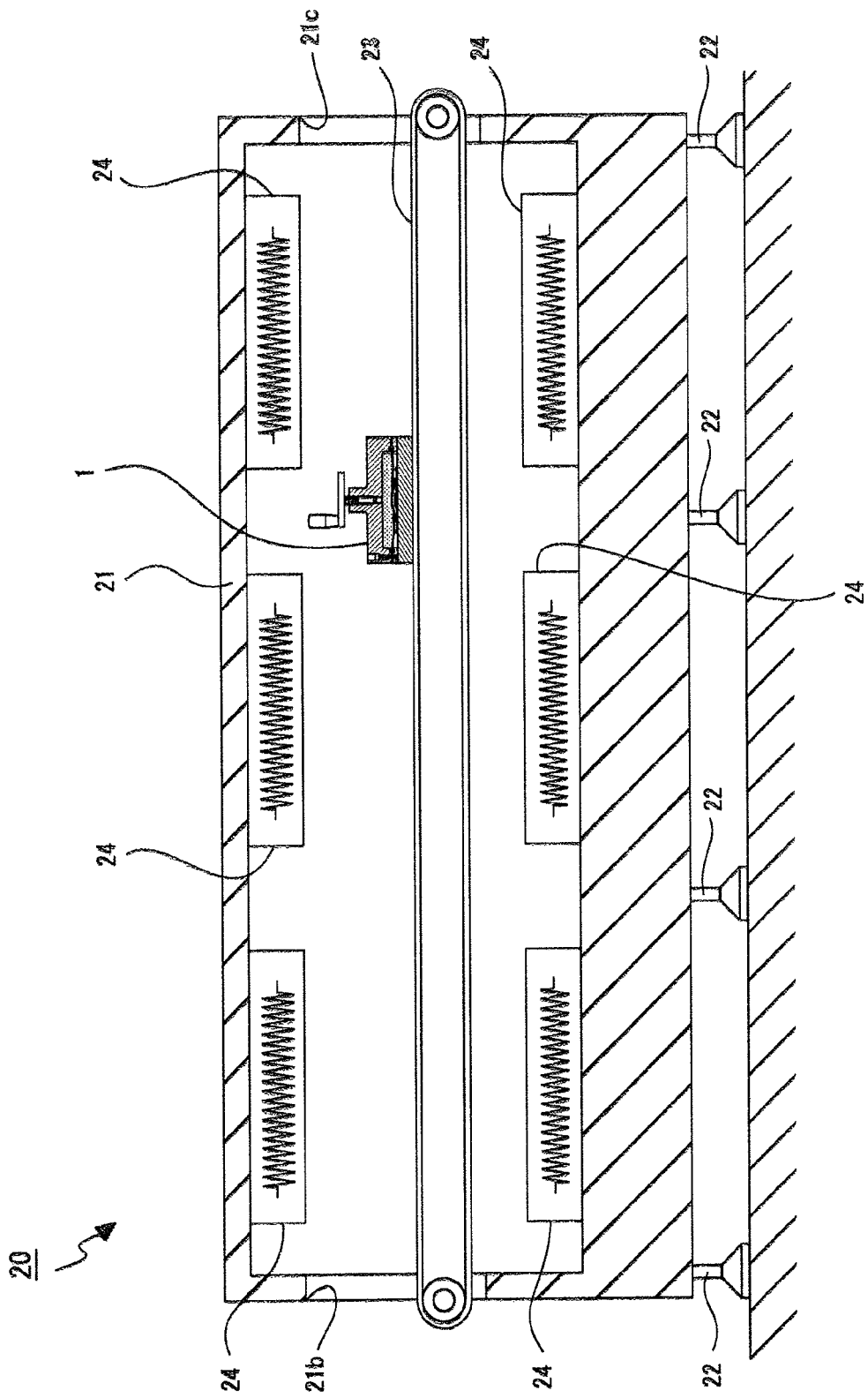
FIG. 9 is a partially cross-sectioned schematic side view illustrating a state that the element pressing apparatus is conveyed and heated on a conveyor in the heating furnace.

Then, the element pressing apparatus 1 is conveyed on the conveyor 23 from the inlet port 21b to the outlet port 21c (refer to FIG. 9). When the element pressing apparatus 1 is conveyed on the conveyor 23 from the inlet port 21b to the outlet port 21c, the element pressing apparatus 1 is heated by the heaters 24, and the heat is transferred to the electrode terminals 52a of the electronic components 52 and the electrodes 51a of the board 51 arranged in the arrangement space 7 of the element pressing apparatus 1. The heating is performed at a temperature of, for example, approximately, 200° C. for a predetermined time, for example, 10 to 20 minutes.

If the heating is performed in the heating furnace 20 for a predetermined time while the electronic components 52 are pressed as described above, each electrode terminal 52a and each electrode 51a subjected to the positioning are bonded to each other through a solid-state diffusion.

The element pressing apparatus 1 conveyed on the conveyor 23 to the outlet port 21c is unloaded from the heating furnace 20, and the pressing of the electronic components 52 using the element pressing apparatus 1 is terminated. The termination of the pressing is performed as the hydraulic pressure change portion 9 is rotated in a direction adverse to the previous direction, and the supported shaft portion 12 is displaced upward. As the supported shaft portion 12 is displaced upward, the deformed oil seal member 14 is recovered to its original state.

Figure 10:
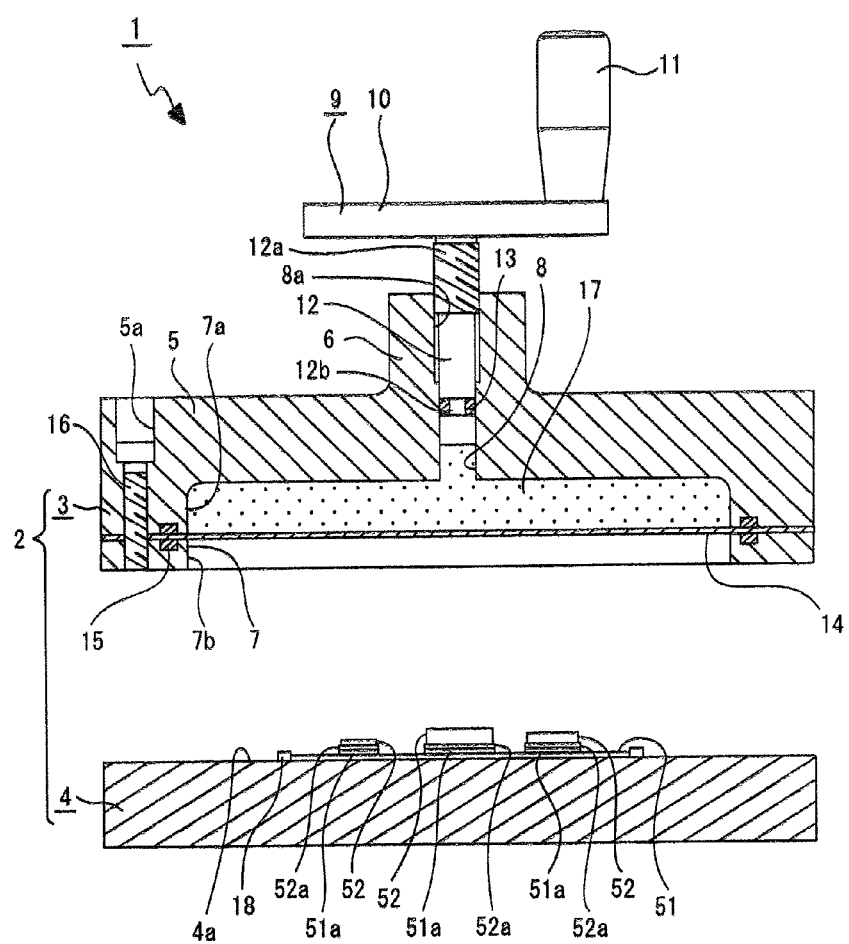
FIG. 10 is a schematic cross-sectional view illustrating a state that the element pressing apparatus is unloaded from the heating furnace, and the first and second bases are separated.

Then, the fastening screws 19 between the first and second bases 3 and 4 are unfastened, and the first or second base 3 or 4 is moved using the shift mechanism, so that the first and second bases 3 and 4 are separated from each other (refer to FIG. 10).

Figure 11:
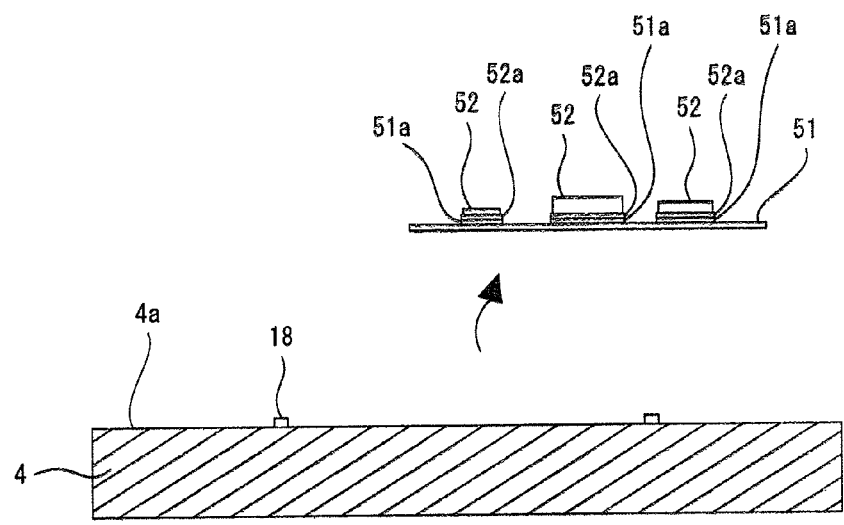
FIG. 11 is a schematic cross-sectional view illustrating a state that the board having an electronic component bonded thereon is uninstalled from the element pressing apparatus.

Subsequently, the board 51 having the bonded electronic components 52 is removed from the board placing surface 4a of the second base 4 and is cooled (refer to FIG. 11). As the board 51 is cooled, an excellent bonding state between the electrode terminals 52a and the electrodes 51a is obtained to form the circuit board 50.

It is noted that the cooling may be performed while the board 51 is placed on the board placing surface 4a of the second base 4.

Figure 12:
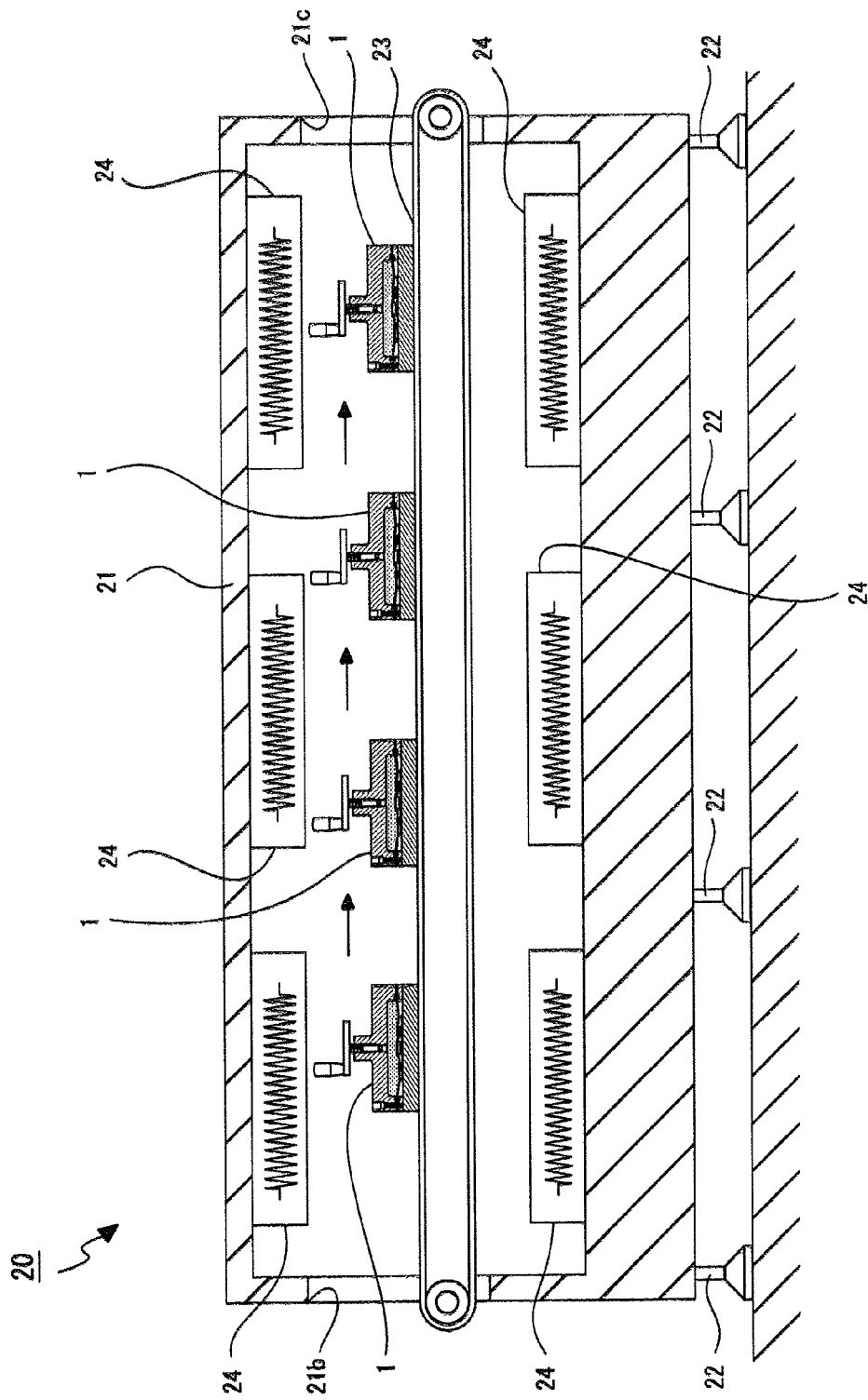
FIG. 12 is a partially cross-sectioned schematic side view illustrating a state that a plurality of element pressing apparatuses are sequentially loaded and conveyed on the heating furnace.

In the heating system using the element pressing apparatus 1, the element pressing apparatuses 1 are sequentially loaded on the heating furnace 20 and are heated while the electronic components 52 are pressed as illustrated in FIG. 12. Therefore, it is possible to continuously form the circuit board 50 obtained by bonding the electronic components 52 having different heights to the board 1 through a solid-state bonding.

Therefore, a highly close contact state between the electrode terminals 52a and the electrodes 51a is obtained by virtue of the pressure of the oil 17 using the element pressing apparatuses 1, and the element pressing apparatuses 1 are then sequentially loaded on the heating furnace 20. As a result, it is possible to improve productivity.

In addition, the heating furnace 20 is provided with the conveyor 23 that conveys the element pressing apparatuses 1 from the inlet port 21b to the outlet port 21c. Therefore, it is possible to easily and rapidly load and unload the element pressing apparatuses 1 into and from the heating furnace 20 and control a conveyance speed of the conveyor 23 depending on a heating time necessary in the bonding. As a result, it is possible to further improve productivity.

First Modification of Element Pressing Apparatus

Figure 13:
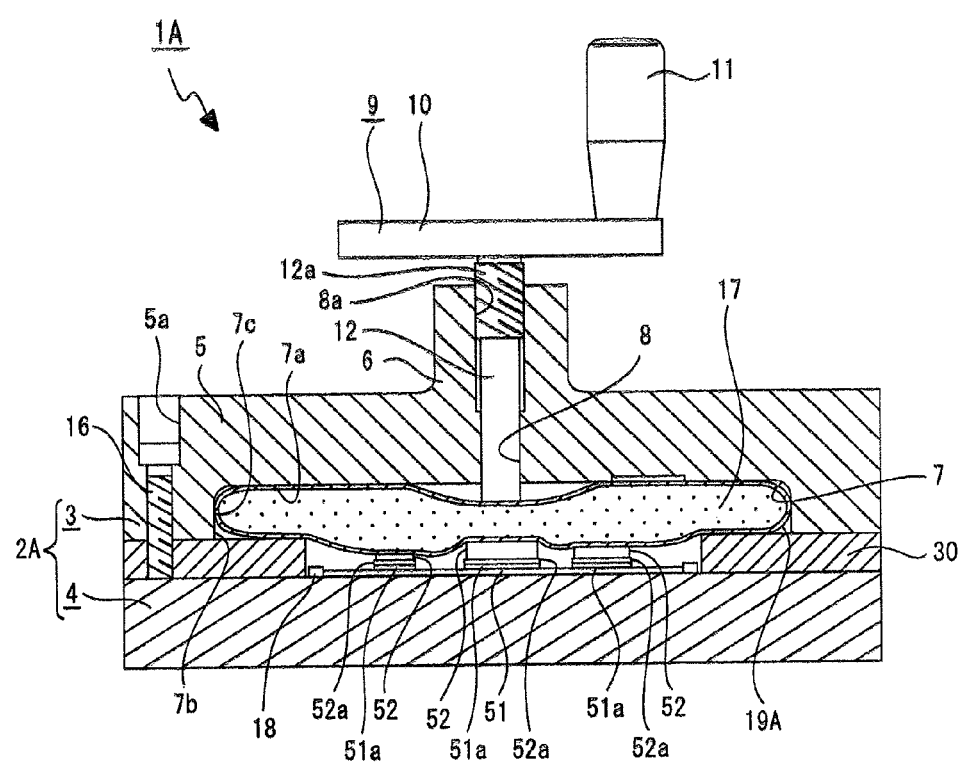
FIG. 13 is a schematic cross-sectional view illustrating an element pressing apparatus according to a first modification.

Next, a description will be made for a first modification of the element pressing apparatus (refer to FIG. 13).

It is noted that the element pressing apparatus 1A according to a first modification described below is different from the aforementioned element pressing apparatus 1 in the oil encapsulation state, a configuration of the base casing, and a configuration of the oil seal member. Therefore, a description will be made in detail only for the parts different from those of the element pressing apparatus 1, and other parts similar to those of the element pressing apparatus 1 will not be described repeatedly, in which like reference numerals denote like elements.

The element pressing apparatus 1A includes a base casing 2A and necessary parts installed in or supported by the base casing 2A. The base casing 2A includes a first base 3, a second base 4, and a middle base 30 formed of a metallic material having a high thermal conductivity. The middle base 30 is positioned between the first and second bases 3 and 4.

The middle base 30 is formed in an annular plate shape and has an inner circumferential surface positioned inner than that of the first base 3. Therefore, due to the middle base 30, a diameter of the lower part of the arrangement space 7 is smaller than a diameter of the upper part thereof, and the outer circumferential portion of the arrangement space 7 serves as a holding portion 7c.

The first base 3 and the middle base 30 are coupled to each other using installation screws 16. While the middle base 30 is coupled to the first base 3, the middle base 30 and the second base 4 are couplable to or separable from each other in a vertical direction.

The hydraulic pressure change portion 9 is rotatably supported by the first base 3. However, the installation trench 12b is not formed in the supported shaft portion 12, and the packing 13 is not installed in the supported shaft portion 12.

An oil seal member 14A formed in a pouch shape is arranged in the arrangement space 7. The inside of the oil seal member 14A is filled with oil 17. The oil seal member 14 is formed of, for example, stainless steel, rubber, and the like having a thin-film shape so that it can be deformed depending on a (hydraulic) oil pressure of the oil 17. The oil seal member 14A is arranged in the arrangement space 7 such that a part thereof (outer circumference) is inserted into and held by the holding portion 7c.

A lower end surface of the supported shaft portion 12 of the hydraulic pressure change portion 9 makes contact with a surface of the oil seal member 14A. As the supported shaft portion 12 is vertically displaced in the support hole 8, a pressing state of the supported shaft portion 12 to the oil seal member 14A changes to deform the oil seal member 14A.

In the solid-state diffusion bonding of the electronic components 52 to the board 51 using the element pressing apparatus 1A configured as described above, the oil seal member 14A is pressed by the supported shaft portion 12 of the hydraulic pressure change portion 9 to change a hydraulic pressure and press the electronic components 52. However, a sequence of the solid-state diffusion bonding is similar to that of the element pressing apparatus 1. Therefore, the sequence of the solid-state diffusion bonding of the electronic components 52 to the board 51 using the element pressing apparatus 1A will not be described repeatedly.

As described above, in the element pressing apparatus 1A, the oil seal member 14A is formed in a pouch shape, and the oil 17 is filled in the oil seal member 14A and is sealed in the arrangement space 7. Therefore, the arrangement of the oil 17 in the arrangement space 7 is simple, and it is possible to reliably prevent a leakage of the oil 17 without using an oil leakage prevention member.

Second Modification of Element Pressing Apparatus

Figure 14:
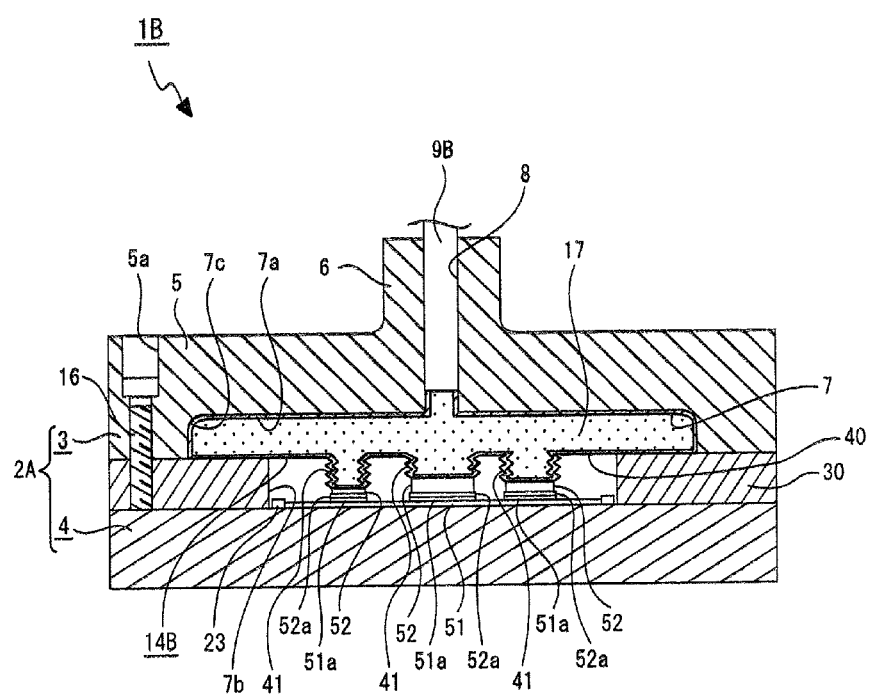
FIG. 14 is a schematic cross-sectional view illustrating an element pressing apparatus according to a second modification.

Next, a description will be made for a second modification of the element pressing apparatus (refer to FIG. 14).

It is noted that the element pressing apparatus 1B according to the second modification described below is different from the aforementioned element pressing apparatus 1A in a configuration of the oil seal member and a configuration of the hydraulic pressure change portion. Therefore, a description will be made in detail only for the parts different from those of the element pressing apparatus 1A, and other parts similar to those of the element pressing apparatus 1A will not be described repeatedly, in which like reference numerals denote like elements.

An oil seal member 14B formed in a pouch shape is arranged in the arrangement space 7 of the element pressing apparatus 1B. The inside of the oil seal member 14B is filled with oil 17. The oil seal member 14B is formed of, for example, stainless steel, rubber, and the like having a thin film state. The oil seal member 14B includes a main filling portion 40 filled with an amount of oil 17 and bellows portions 41 protruding downward from the main filling portion 40.

The number of the bellows portions 41 is equal to the number of the electronic components 52. The bellows portions 41 are provided directly over the electronic components 52. The bellows portions 41 are formed to have different vertical lengths depending on the heights of the electronic components 52. As the height of electronic component 52 increases, the vertical length of the bellows portion 41 is shortened. The bellows portions 41 expand or contract depending on the pressure of the oil 17 encapsulated inside.

The element pressing apparatus 1B is provided with a hydraulic pressure change portion 9B, for example, having a pressure control value (not illustrated) instead of the hydraulic pressure change portion 9.

As the pressure of the oil 17 changes by the hydraulic pressure change portion 9, the bellows portions 41 vertically expand or contract depending on the changed pressure.

In the element pressing apparatus 1B configured in this manner, as the pressure of the oil 17 changes by the hydraulic pressure change portion 9B, each bellows portion 41 expands or contracts to change the pressing force of the bellows portion 41 to the electronic component 52. Therefore, the pressure applied to the electronic component 52 changes.

In the element pressing apparatus 1B, the electronic components 52 are pressed by the bellows portions 41 expanding or contracting depending on a change of the pressure of the oil 17 as described above. However, a sequence of the solid-state diffusion bonding is similar to that of the element pressing apparatus 1. Therefore, the sequence of the solid-state diffusion bonding of the electronic components 52 to the board 51 using the element pressing apparatus 1B will not be described repeatedly.

As described above, in the element pressing apparatus 1B, the oil seal member 14B is provided with a plurality of bellows portions 41 expanding or contracting in a junction/disjunction direction of the electronic components 52. Each upper surface of the electronic components 52 adjoins with each lower surface of the bellows portions 41, and the bellows portions 41 expand or contract depending on the heights of the electronic components 52 to press the electronic components 52.

In order to individually press the electronic components 52 using the bellows portions 41, the lengths of the bellows portions 41 change depending on the heights of the electronic components 52. Therefore, it is possible to press each electronic component 52 with an optimal pressure depending on the heights of the electronic components 52.

It is noted that, in the element pressing apparatus 1B, a guide shaft (not illustrated) extending in a vertical direction may be arranged in each of the bellows portions 41 so that the bellows portions 41 expand or contract along the guide shaft.

By arranging the guide shaft vertically extending in each of the bellows portions 41, it is possible to prevent the bellows portions 41 from expanding or contracting in an inclined direction deviated from the vertical direction and appropriately perform the pressing to the electronic components 52 using the bellows portions 41.

Third Modification of Element Pressing Apparatus

Figure 15:
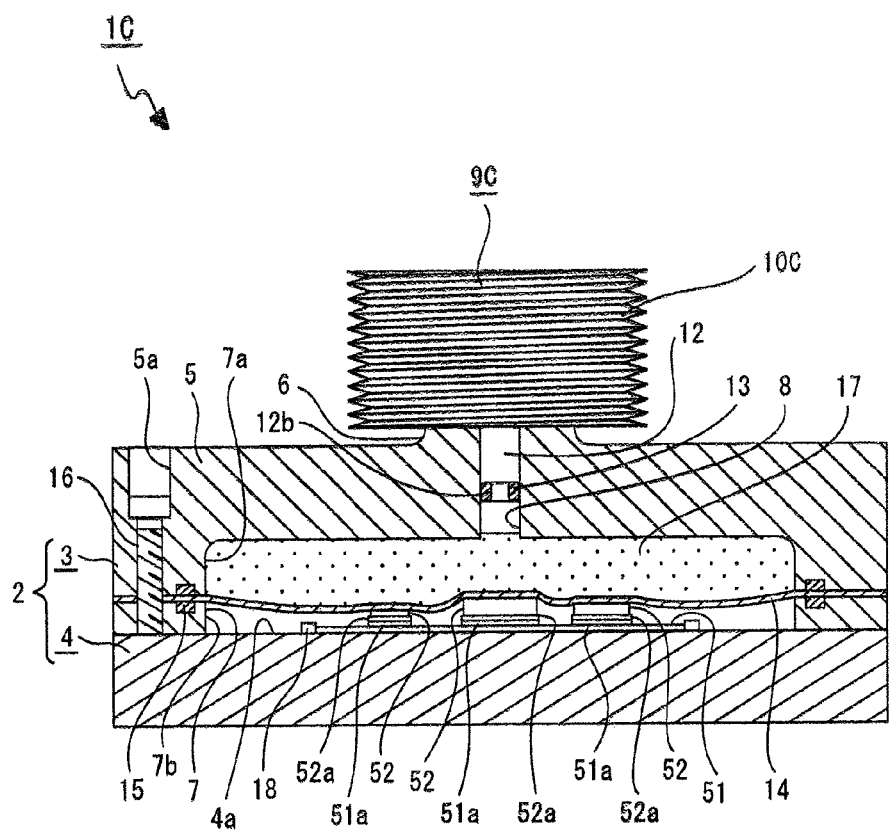
FIG. 15 is a schematic cross-sectional view illustrating an element pressing apparatus according to a third modification.

Next, a description will be made for a third modification of the element pressing apparatus (refer to FIG. 15).

It is noted that the element pressing apparatus 1C according to the third modification described below is different from the aforementioned element pressing apparatus 1 in a configuration of the hydraulic pressure change portion. Therefore, a description will be made in detail only for the parts different from those of the element pressing apparatus 1, and other parts similar to those of the element pressing apparatus 1 will not be described repeatedly, in which like reference numerals denote like elements.

A hydraulic pressure change portion 9C is rotatably supported by the first base 3 of the element pressing apparatus 1C. The hydraulic pressure change portion 9C includes a gear portion 10C having a thread formed on an outer circumferential surface and a supported shaft portion 12 protruding downward from the center of the gear portion 10C.

A driving gear (not illustrated) meshes with the gear portion 10C of the hydraulic pressure change portion 9C and is rotated by a driving force of a driving motor (not illustrated). As the driving gear is rotated by virtue of the driving force of the driving motor, the entire hydraulic pressure change portion 9C having the gear portion 10C meshing with the driving gear is rotated to advance the screw-joining portion 12a to the thread 8a, so that the hydraulic pressure change portion 9C is vertically displaced with respect to the first base 3C depending on the rotation direction. Therefore, the supported shaft portion 12 is vertically displaced in the support hole 8.

In the solid-state diffusion bonding of the electronic components 52 to the board 51 using the element pressing apparatus 1C configured as described above, a hydraulic pressure changes by vertically displacing the supported shaft portion 12 of the hydraulic pressure change portion 9C to press the electronic components 52. However, a sequence of the solid-state diffusion bonding is similar to the element pressing apparatus 1. Therefore, the sequence of the solid-state diffusion bonding of the electronic components 52 to the board 51 using the element pressing apparatus 1C will not be described repeatedly.

As described above, in the element pressing apparatus 1C, the gear portion 10C is provided in the hydraulic pressure change portion 9C. Therefore, it is possible to rotate the hydraulic pressure change portion 9C by virtue of the driving force of the driving motor instead of a manual force. As a result, it is possible to reduce a work time and improve work efficiency in the pressing of the electronic components 52 to the board 51.

CONCLUSION

As described above, in the element pressing apparatuses 1, 1A, 1B, and 1C, the oil seal members 14, 14A, and 14B adjoin and press a plurality of electronic components 52 having different heights, and the electrode terminals 52a are pressed against the electrodes 51a of the board 51 by virtue of the pressure of the oil 17.

Therefore, the electrode terminals 52a of the electronic components 52 having different heights are pressed to be bonded to the electrodes 51a of the board 51 at once using the oil seal members 14, 14A, or 14B by virtue of the pressure of the oil 17. As a result, it is possible to obtain a highly close contact state between the electrode terminals 52a and the electrodes 51a and improve miniaturization and productivity.

OTHERS

Hereinbefore, a description has been made for an example in which the electrode terminal 52a of the electronic component 52 is bonded to the electrode 51a of the board 51 using a solid-state diffusion bonding. However, the invention may also be applied to various fields, such as a so-called chip-on-chip technique for obtaining a composite component by bonding semiconductor chips (electronic components) to each other, an embedded board (circuit board) obtained by bonding an electrode in a semiconductor package and the like, or a semiconductor apparatus.

What is claimed is:

1. An element pressing apparatus for pressing a plurality of electrode terminals of a plurality of electronic components including at least two electronic components having different heights against a respective plurality of electrodes of a board, comprising:
   a base casing having first and second bases couplable to or separable from each other to form an arrangement space for internally arranging the board and the electronic components while the first and second bases are coupled to each other;
   oil encapsulated in the arrangement space;
   an oil seal member that seals the oil in the arrangement space and is deformed depending on a pressure of the oil; and
   a hydraulic pressure change portion that is supported by the base casing and changes the pressure of the oil,
   wherein the pressure of the oil changes by the hydraulic pressure change portion to press the oil seal member against the plurality of electronic components and press each of the electrode terminals against each of the electrodes when the board and the plurality of electronic components are arranged in the arrangement space by positioning and placing each of the electrode terminals on each of the electrodes.

2. The element pressing apparatus according to claim 1, wherein the oil seal member is formed in a pouch shape to fill the oil in the oil seal member.

3. The element pressing apparatus according to claim 1, wherein the oil seal member is provided with a plurality of bellows portions expanding and contracting in a junction/disjunction direction of the electronic components, and
   the bellows portions expand or contract depending on heights of the electronic components while the plurality of bellows portions adjoin the plurality of electronic components.

4. A heating system using an element pressing apparatus for pressing a plurality of electrode terminals of a plurality of electronic components including at least two electronic components having different heights to a plurality of electrodes of a board,
   the element pressing apparatus including:
   a base casing having first and second bases couplable to or separable from each other to form an arrangement space for internally arranging the board and the electronic components while the first and second bases are coupled to each other;
   oil encapsulated in the arrangement space;
   an oil seal member that seals the oil in the arrangement space and is deformed depending on a pressure of the oil; and
   a hydraulic pressure change portion that is supported by the base casing and changes the pressure of the oil,
   wherein the pressure of the oil changes by the hydraulic pressure change portion to press the oil seal member to the plurality of electronic components and press each of the electrode terminals against each of the electrodes when the board and the plurality of electronic components are arranged in the arrangement space by positioning and placing each of the electrode terminals on each of the electrodes, and
   the element pressing apparatus is heated in a heating furnace having a heater while the oil seal member presses the plurality of electronic components.

5. The heating system according to claim 4, wherein the heating furnace has an inlet port where the element pressing apparatus is loaded and an outlet port where the element pressing apparatus is unloaded, and
   the heating furnace is provided with a conveyor for conveying the element pressing apparatus from the inlet port to the outlet port.

* * * * *